United States Patent
Laird et al.

(10) Patent No.: US 8,091,063 B2
(45) Date of Patent: Jan. 3, 2012

(54) METHOD AND APPARATUS FOR CHARACTERIZING AN INTEGRATED CIRCUIT MANUFACTURING PROCESS

(75) Inventors: Mark Laird, Hutto, TX (US); Wayne Clark, Driftwood, TX (US); Yiping Szu, Acton, MA (US)

(73) Assignee: Synopsys, Inc., Mountain View, CA (US)

( * ) Notice: Subject to any disclaimer, the term of this patent is extended or adjusted under 35 U.S.C. 154(b) by 464 days.

(21) Appl. No.: 12/166,781

(22) Filed: Jul. 2, 2008

(65) Prior Publication Data

US 2010/0005436 A1  Jan. 7, 2010

(51) Int. Cl.
*G06F 17/50* (2006.01)
(52) U.S. Cl. ......... 716/136; 716/55; 716/111; 716/139
(58) Field of Classification Search .............. 716/55, 716/111, 136, 139
See application file for complete search history.

(56) References Cited

U.S. PATENT DOCUMENTS 7,003,742 B2 * 2/2006 Saxena et al. ............... 716/102
7,761,278 B2 * 7/2010 Chidambarrao et al. ....... 703/14

* cited by examiner

*Primary Examiner* — Thuan Do
(74) *Attorney, Agent, or Firm* — Park, Vaughan, Fleming & Dowler LLP; Laxman Sahasrabuddhe (57) ABSTRACT

A system that characterizes an integrated circuit manufacturing process is presented. During operation, the system receives a layout which includes a plurality of test structures for semiconductor devices, wherein each test structure varies one or more design variables. The system then fabricates a plurality of wafers based on the layout, wherein each wafer in the plurality of wafers is fabricated using one of a plurality of process settings. Next, the system obtains performance characteristics for the plurality of test structures on the plurality of wafers. The system then generates a process model that is based on at least the effect that values for the one or more design variables and the plurality of process settings have on the performance characteristics of the plurality of test structures.

18 Claims, 9 Drawing Sheets

FIG. 9

METHOD AND APPARATUS FOR CHARACTERIZING AN INTEGRATED CIRCUIT MANUFACTURING PROCESS

BACKGROUND

1. Field of the Invention

The present invention relates to techniques for characterizing an integrated circuit manufacturing process.

2. Related Art

Test chips are typically created to characterize an integrated circuit (IC) manufacturing process. These test chips may include test devices with features which are varied so that the IC manufacturing process can be characterized over a specified range of device features. In some cases, the specified range of device features includes sub-nominal device features (e.g., a gate length that is smaller than the design rules). Unfortunately, sub-nominal device features can cause random defectivity issues in other circuits that are present on the same test chip. For example, the sub-nominal device feature can break off during the manufacturing process and can cause defects on other parts of the test chip. However, excluding test devices with sub-nominal device features reduces the coverage of the IC manufacturing process. Hence, what is needed is a method and an apparatus for characterizing an IC manufacturing process without the above-mentioned problems.

SUMMARY

Some embodiments of the present invention provide a system that characterizes an IC manufacturing process. During operation, the system receives a layout which includes a plurality of test structures for semiconductor devices, wherein each test structure varies one or more design variables. The system then fabricates a plurality of wafers based on the layout, wherein each wafer in the plurality of wafers is fabricated using one of a plurality of process settings. Next, the system obtains performance characteristics for the plurality of test structures on the plurality of wafers. The system then generates a process model that is based on at least the effect that values for the one or more design variables and the plurality of process settings have on the performance characteristics of the plurality of test structures.

In some embodiments, each process setting in the plurality of process settings produces specified changes in the values for the one or more design variables.

In some embodiments, the system measures the specified changes in the values for one or more design variables for a given process setting.

In some embodiments, the performance characteristics include a yield and/or a pass/fail rate.

In some embodiments, the process model is a semiconductor device yield model.

In some embodiments, the process model predicts performance characteristics for test structures which include values for the one or more design variables that were not included in the layout.

In some embodiments, the process model is a parametric equation which is based on at least the plurality of process settings and the values for the one or more design variables.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description can be embodied as code, data structures, and/or data, which can be stored on a computer-readable storage medium as described above. When a computer system reads and executes the code and/or data stored on the computer-readable storage medium, the computer system performs the methods and processes embodied as code, data structures, and/or data that are stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

In some embodiments, the defect issues associated with sub-nominal test structures on a test chip can be solved by using a conservative experimental design in a layout (e.g, excluding the use of sub-nominal device features), which reduces the probability that the test chip circuit will become a source of defects. In some embodiments, the sub-nominal device features can be created by varying IC processing parameters. For example, sub-nominal features can be created by intentionally underexposing or overexposing the test chip during the photolithography processing step. The process window results can then be extracted by combining the data obtained for the test structures from the various processed wafers.

Computer System

Figure 1A:
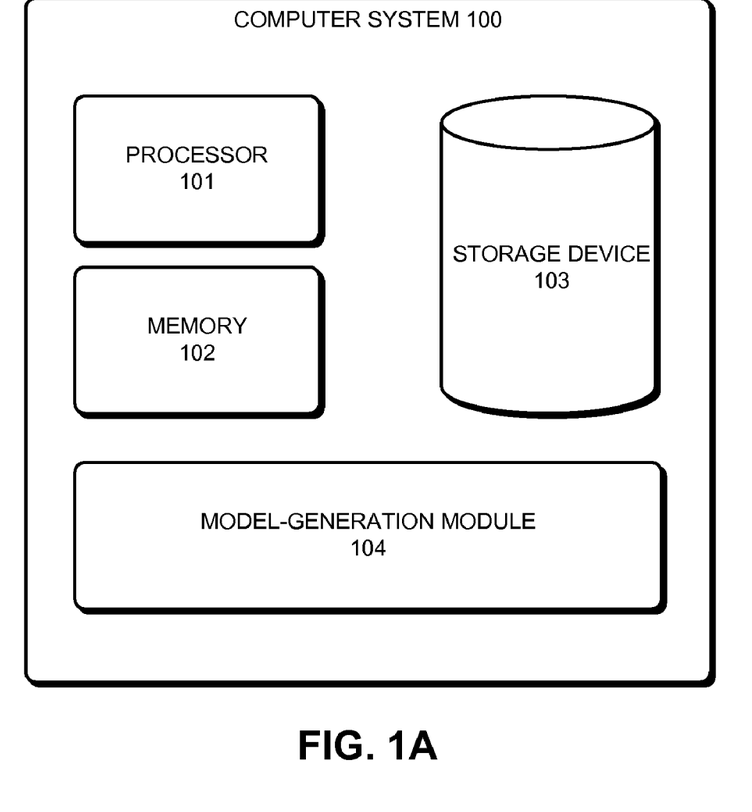
FIG. 1A presents a block diagram illustrating a computer system in accordance with embodiments of the present invention.

FIG. 1A presents a block diagram illustrating a computer system 100 in accordance with some embodiments of the present invention. Computer system 100 includes one or more of processor 101, memory 102, storage device 103, and model-generation module 104.

Processor 101 can generally include any type of processor, including, but not limited to, a microprocessor, a mainframe computer, a digital signal processor, a personal organizer, a device controller and a computational engine within an appliance. Memory 102 can include any type of memory, including but not limited to, dynamic random access memory (DRAM), static random access memory (SRAM), flash memory, read only memory (ROM), and any other type of memory now known or later developed. Storage device 103 can include any type of non-volatile storage device that can be coupled to a computer system. This includes, but is not limited to, magnetic, optical, and magneto-optical storage devices, as well as storage devices based on flash memory and/or battery-backed up memory.

In some embodiments of the present invention, model-generation module 104 is separate from computer system 100. Note that model-generation module 104 is described in more detail below with reference to FIG. 1B.

Figure 1B:
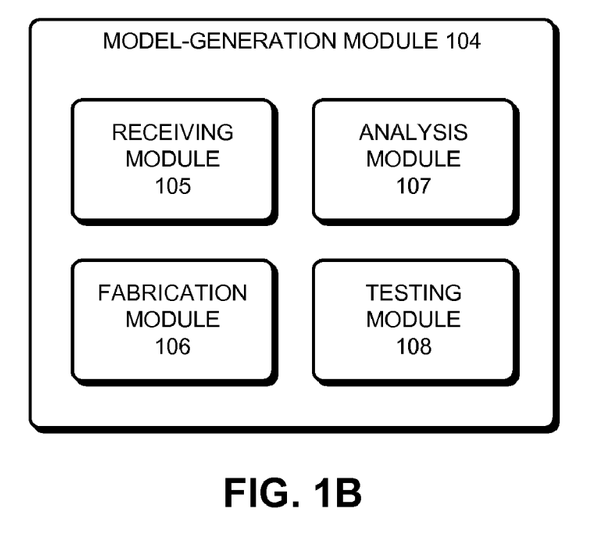
FIG. 1B presents a block diagram of a model-generation module in accordance with embodiments of the present invention.

FIG. 1B presents a block diagram of model-generation module 104 in accordance with some embodiments of the present invention. Model-generation module 104 includes one or more of: receiving module 105, fabrication module 106, analysis module 107, and testing module 108. Receiving module 105 is configured to receive a layout which includes a plurality of test structures for semiconductor devices, wherein each test structure varies one or more design variables. Fabrication module 106 is configured to fabricate a plurality of wafers based on the layout, wherein each wafer in the plurality of wafers is fabricated using one of a plurality of process settings. Analysis module 107 is configured to: obtain performance characteristics for the plurality of test structures on the plurality of wafers; and generate a process model that is based on at least the effect that values for the one or more design variables and the plurality of process settings have on the performance characteristics of the plurality of test structures. Testing module 108 is configured to measure the specified changes in the values for one or more design variables for a given process setting.

In some embodiments, one or more of receiving module 105, fabrication module 106, analysis module 107, and testing module 108 are included in one or more integrated circuit (IC) chips. For example, these IC chips can include, but are not limited to, application-specific integrated circuit (ASIC) chips, field-programmable gate arrays (FPGAs), and other programmable-logic devices now known or later developed.

Flow Summary and Context

Figure 2:
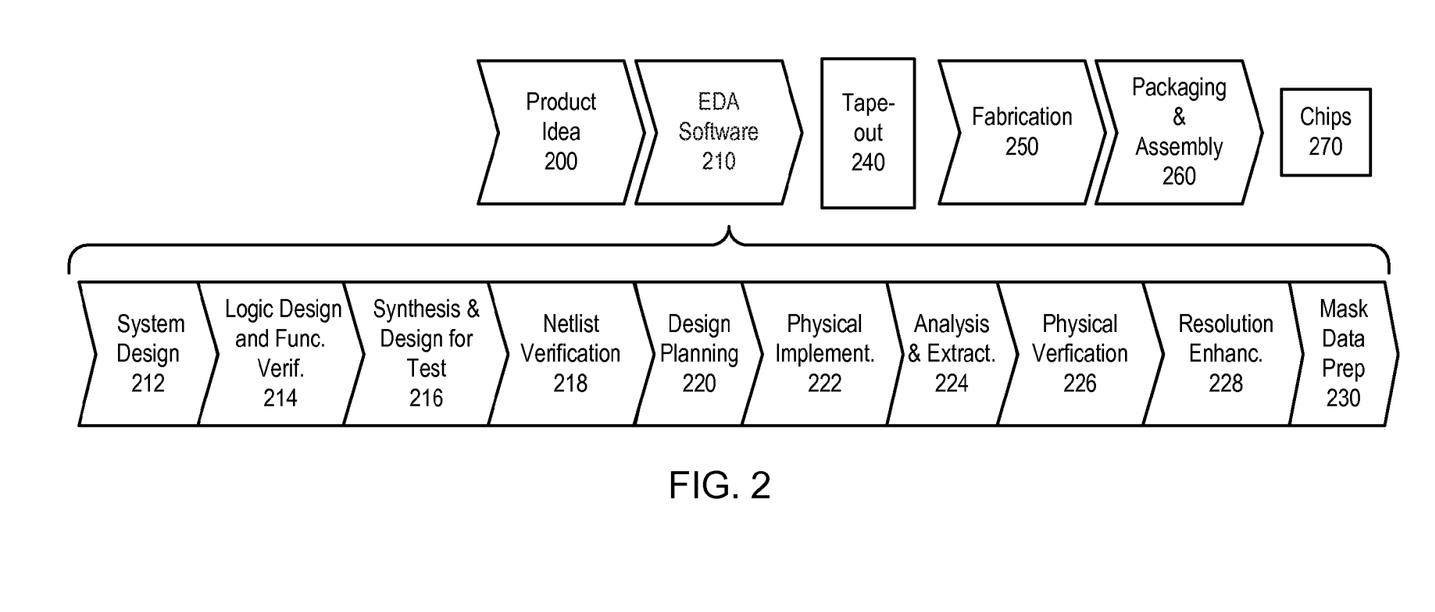
FIG. 2 shows a simplified representation of an exemplary digital ASIC design flow in accordance with embodiments of the present invention.

Before proceeding further with the description, it may be helpful to place this process in context. FIG. 2 shows a simplified representation of an exemplary digital ASIC design flow. At a high level, the process starts with the product idea (step 200) and is realized in an EDA software design process (step 210). When the design is finalized, it can be taped-out (event 240). After tape-out, the fabrication process (step 250) and packaging and assembly processes (step 260) occur, resulting ultimately in finished chips (result 270).

The EDA software design process (step 210) is actually composed of a number of steps 212-230, shown in linear fashion for simplicity. In an actual ASIC design process, the particular design might have to go back through steps until certain tests are passed. Similarly, in any actual design process, these steps may occur in different orders and combinations. This description is, therefore, provided by way of context and general explanation rather than as a specific, or recommended, design flow for a particular ASIC.

A brief description of the components steps of the EDA software design process (step 210) will now be provided:

System design (step 212): The designers describe the functionality that they want to implement and they can perform what-if planning to refine functionality, check costs, etc. Hardware-software architecture partitioning can occur at this stage. Exemplary EDA software products from Synopsys, Inc. that can be used at this step include the Model Architect, Saber, System Studio, and DesignWare® products.

Logic design and functional verification (step 214): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include the VCS, VERA, DesignWare®, Magellan, Formality, ESP and LEDA products.

Synthesis and design for test (step 216): Here, the VHDL/Verilog code is translated to a netlist. The netlist can be optimized for the target technology. Additionally, the design and implementation of tests to permit checking of the finished chip occurs. Exemplary EDA software products from Synopsys, Inc. that can be used at this step include the Design Compiler®, Physical Compiler, Test Compiler, Power Compiler, FPGA Compiler, Tetramax, and DesignWare® products.

Netlist verification (step 218): At this step, the netlist is checked for compliance with timing constraints and for correspondence with the VHDL/Verilog source code. Exemplary EDA software products from Synopsys, Inc. that can be used at this step include the Formality, PrimeTime, and VCS products.

Design planning (step 220): Here, an overall floorplan for the chip is constructed and analyzed for timing and top-level routing. Exemplary EDA software products from Synopsys, Inc. that can be used at this step include the Astro and IC Compiler products.

Physical implementation (step 222): The placement (positioning of circuit elements) and routing (connection of the same) occurs at this step. Exemplary EDA software products from Synopsys, Inc. that can be used at this step include the Astro and IC Compiler products.

Analysis and extraction (step 224): At this step, the circuit function is verified at a transistor level. This, in turn, permits what-if refinement. Exemplary EDA software products from Synopsys, Inc. that can be used at this step include the Astro-Rail, PrimeRail, Primetime, and Star RC/XT products.

Physical verification (step 226): At this step, various checking functions are performed to ensure correctness for:

manufacturing, electrical issues, lithographic issues, and circuitry. Exemplary EDA software products from Synopsys, Inc. that can be used at this step include the Hercules product.

Resolution enhancement (step 228): This step involves geometric manipulations of the layout to improve manufacturability of the design. Exemplary EDA software products from Synopsys, Inc. that can be used at this step include the Proteus, ProteusAF, and PSMGen products.

Mask data preparation (step 230): This step provides the tape-out data for production of masks for lithographic use to produce finished chips. Exemplary EDA software products from Synopsys, Inc. that can be used at this step include the CATS® family of products.

Note that embodiments of the present invention are directed to characterization of a manufacturing process, which may be performed prior to, during, or after any of the ASIC design tasks described above.

Characterizing an IC Manufacturing Process

Note that the discussion below generally refers to "a system," which can include, but is not limited to, a computer system, a server, a client computer system, a cluster of computer systems, a PDA, a mobile device, a component within a plurality of components, and a module within a software application.

Some embodiments use manufacturing process Design of Experiment (DOE) in conjunction with a layout DOE to generate a model of a manufacturing process over a specified process window. The manufacturing process DOE can involve varying one or more process parameters (e.g., varying photoresist exposure time to overexpose or underexpose the photoresist to vary feature sizes, etc.). A layout DOE includes a series of the same device where one or more device parameters (e.g., device feature sizes, etc.) vary across many instances of the device. Note that the parameter that varies is typically referred to as a primary variable (PV). The PV can be varied across the layout DOE with the intent of causing the device to pass or to fail under specified conditions (e.g., specified device sizes, etc.). The failures can then be graphed into a fail rate versus PV value curve.

In some embodiments, the effect of the manufacturing process DOE on the layout parameters is measured at specified sites on the wafer (e.g., S1, S2, S3, etc.). A model can be produced which can extrapolate values for other sites on the wafer. For example, this specified mathematic function can be FPDOE=F(S1, S2, S3).

In some embodiments, the FPDOE model from the manufacturing process DOE can be combined with the PV values from the layout DOE to create a calibrated DOE model, FCDOE=F(FPDOE, PV). For example, consider three wafers wherein the process parameters for the semiconductor manufacturing process are varied. These variations in the process parameters can be selected so that they produce a desired change in a PV. Table 1 presents data from three wafers which have been processed using variations in the process parameters. These process variations produced three different measured X-misalignment values: 0 nm (nominal), −0.018 um, and 0.018 um. Note that these X-misalignment values can affect all features on the wafer, but can be measured at specified sites on the wafer.

Figure 3:
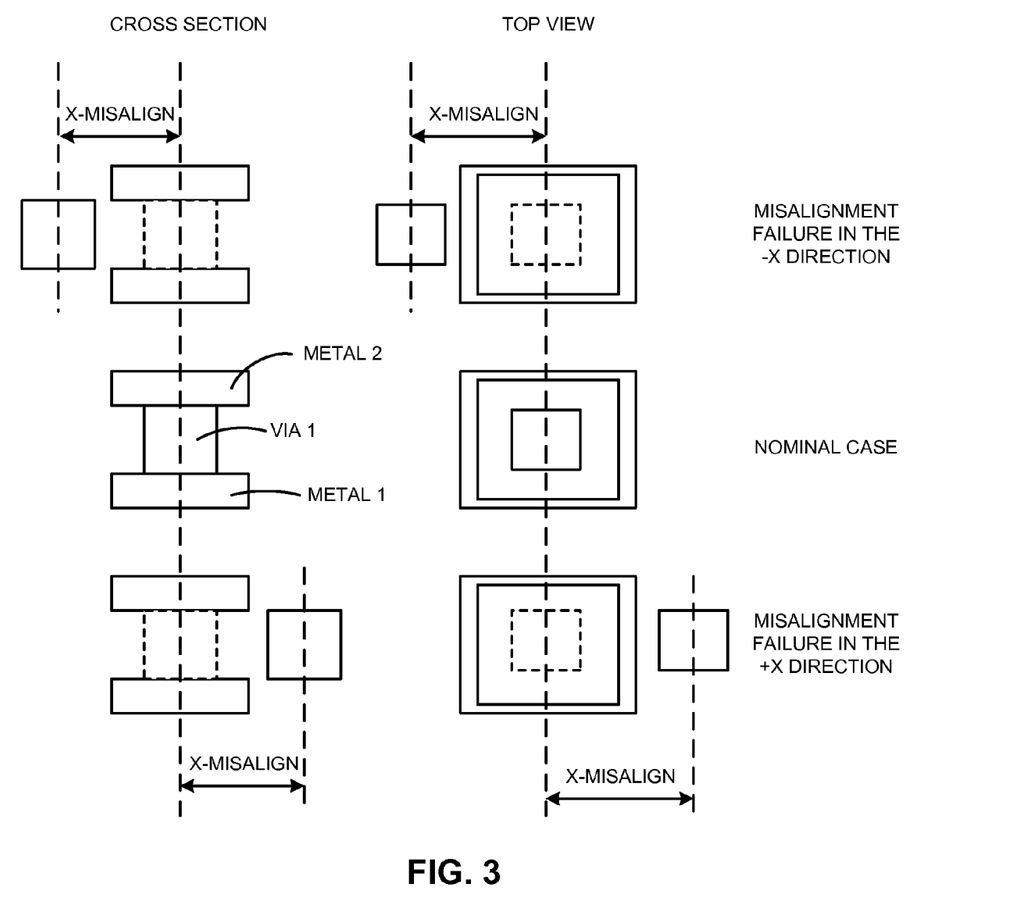
FIG. 3 illustrates exemplary variations of a design variable in accordance with embodiments of the present invention

A layout-based misalignment experiment can also be performed on the same wafers. For example, in FIG. 3, an experiment is created to misalign VIA1 both in the +X direction and the −X direction by specified distances. Note that a via fails when the path from metal 2 through the via to metal 1 is broken (e.g., a +X or a −X misalignment which creates an open circuit).

The effects of the layout-based experiments and the process-based experiments are combined during the manufacturing process. For example, Table 2 illustrates an experiment based on the layout-based misalignment (X_MIS) and a process-based misalignment (X-misalign). Each layout-based experiment on a given wafer in Table 2 includes seven experiments where X_MIS is set to the following values: −0.015 um, −0.01 um, −0.005 um, 0 um, 0.005 um, 0.01 um, and 0.015 um. Three wafers are produced in this example, where each wafer includes a different X-misalign value. Wafer 9 has an X-misalign value of −0.018 um, Wafer 26 has an X-misalign value of +0.018 um, and Wafer 30 has an X-misalign value of 0 um.

In some embodiments, a virtual primary variable is calculated as the sum of the effect on the process-based experiment on the PV and the effect of the layout-based experiment on the PV. For example, in Table 2, the virtual primary variable is the sum of X-misalign and X_MIS.

Figure 4:
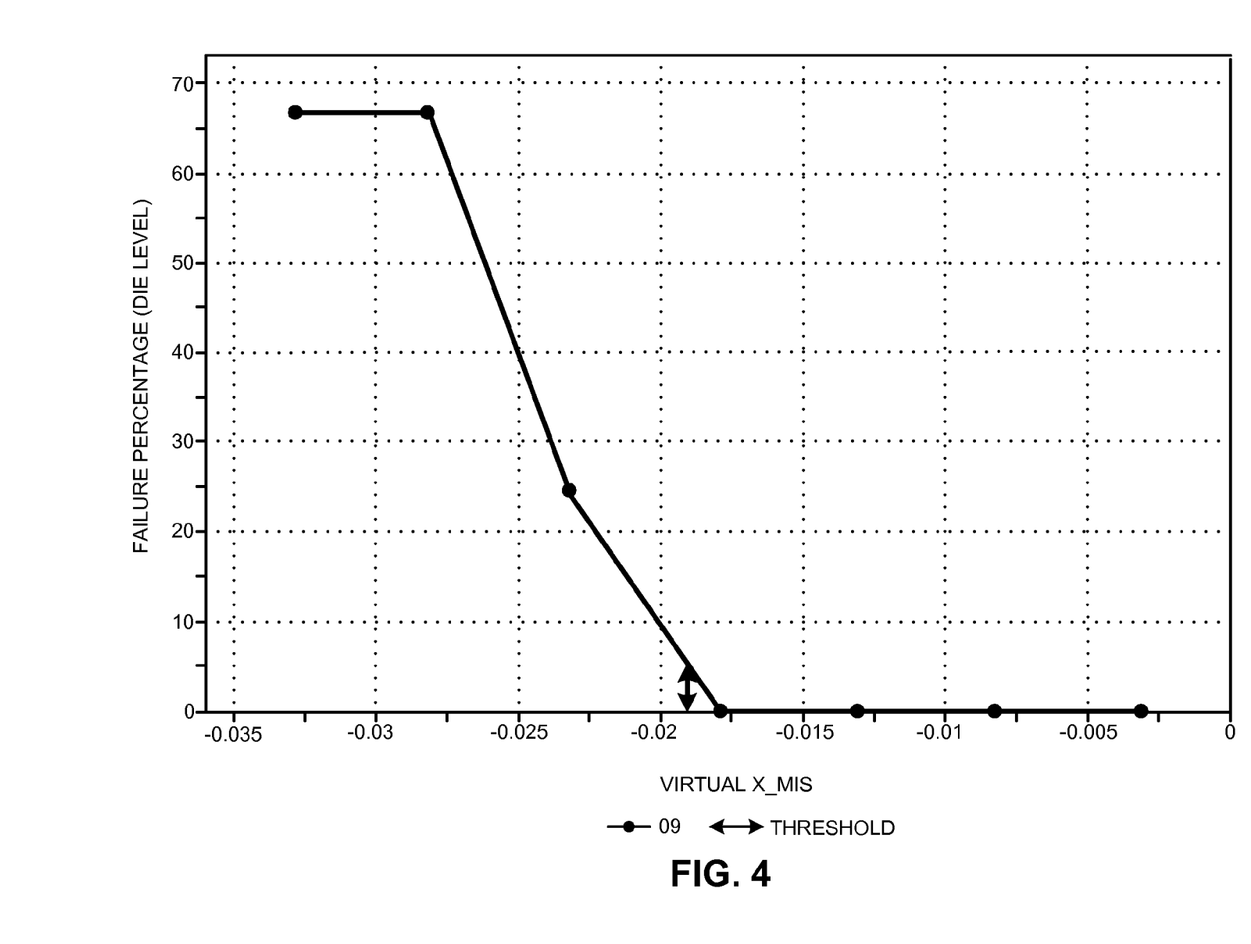
FIG. 4 presents an exemplary graph of performance characteristics obtained from a test wafer in accordance with embodiments of the present invention.
Figure 5:
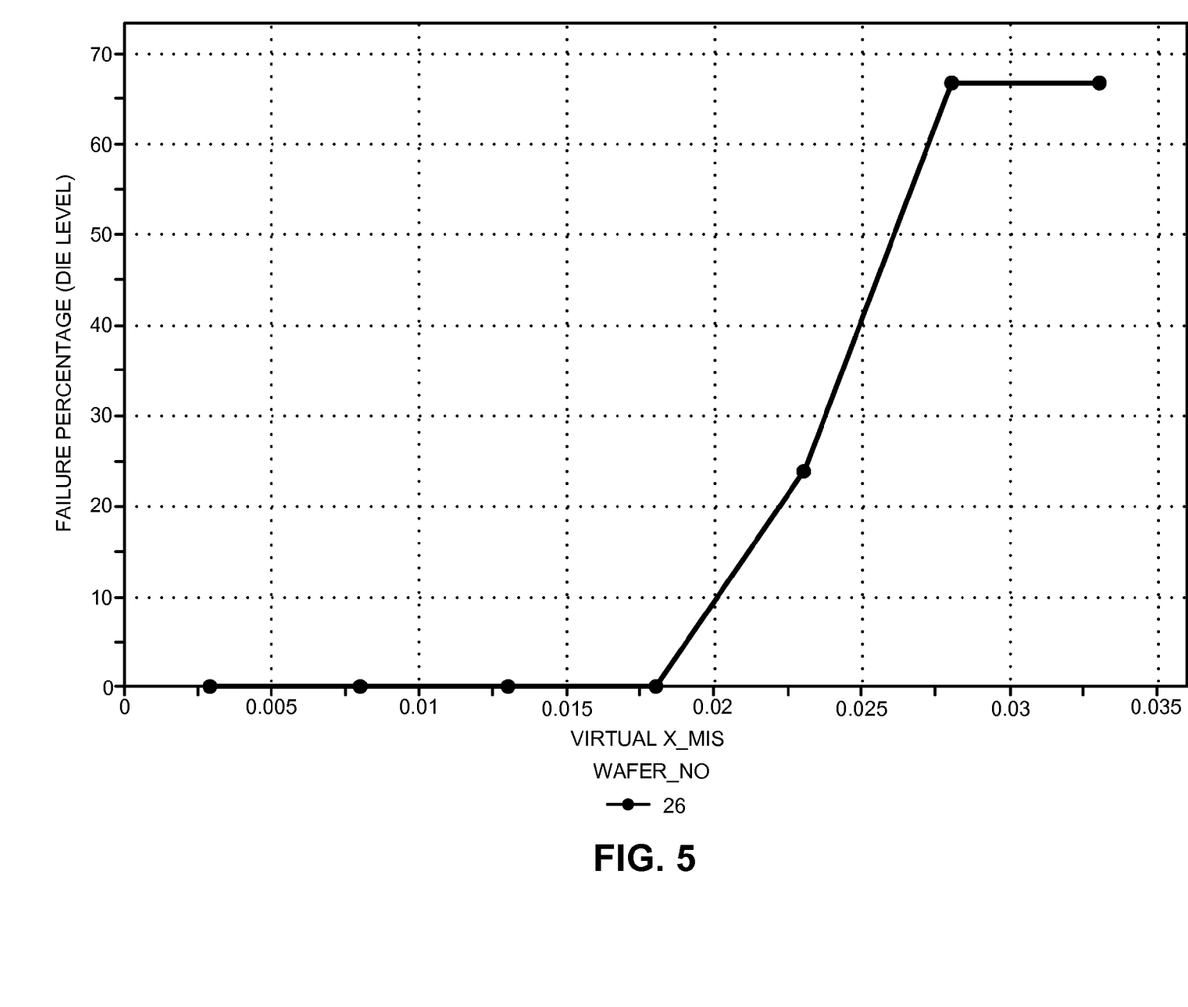
FIG. 5 presents another exemplary graph of performance characteristics obtained from a test wafer in accordance with embodiments of the present invention.
Figure 6:
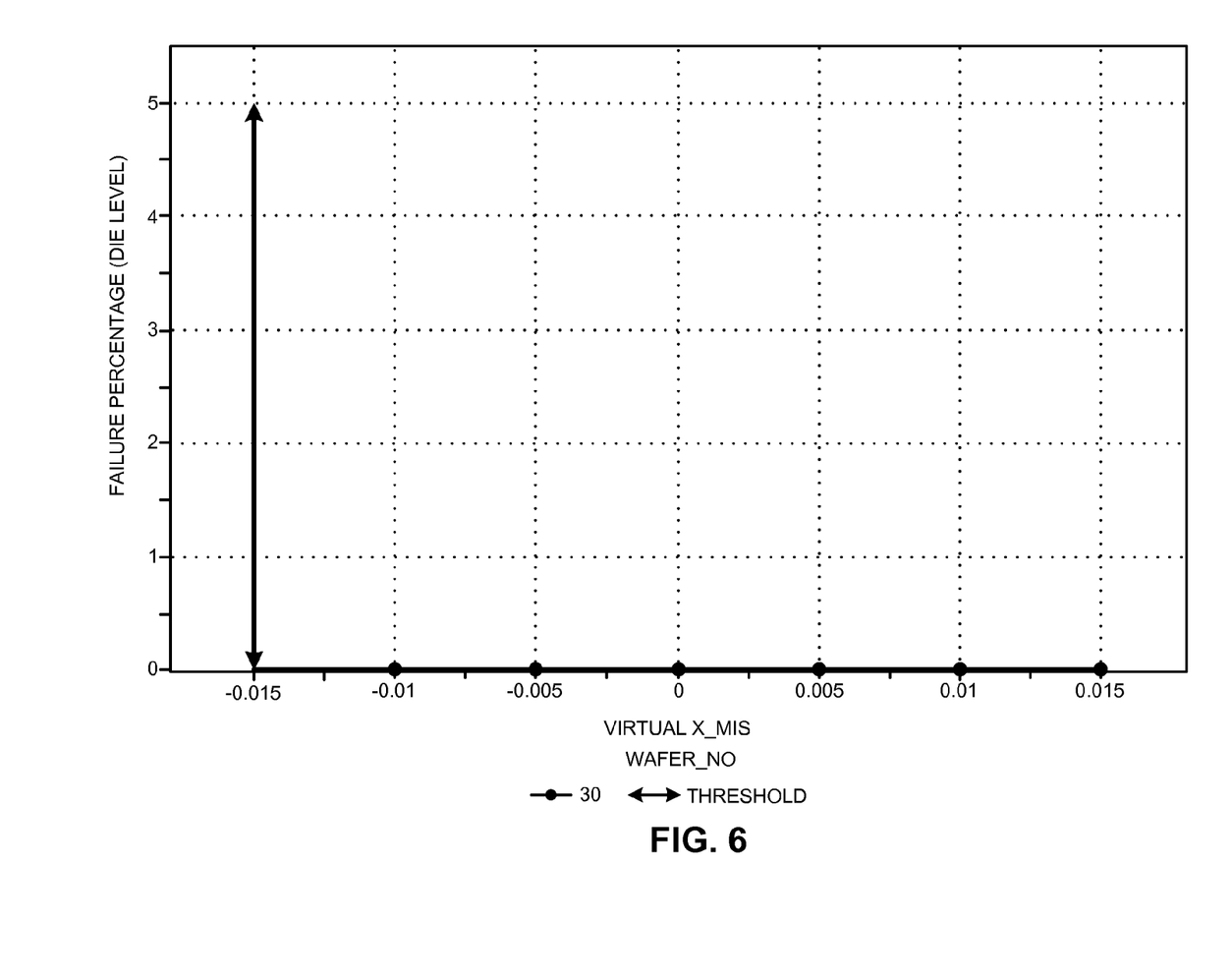
FIG. 6 presents another exemplary graph of performance characteristics obtained from a test wafer in accordance with embodiments of the present invention.
Figure 7:
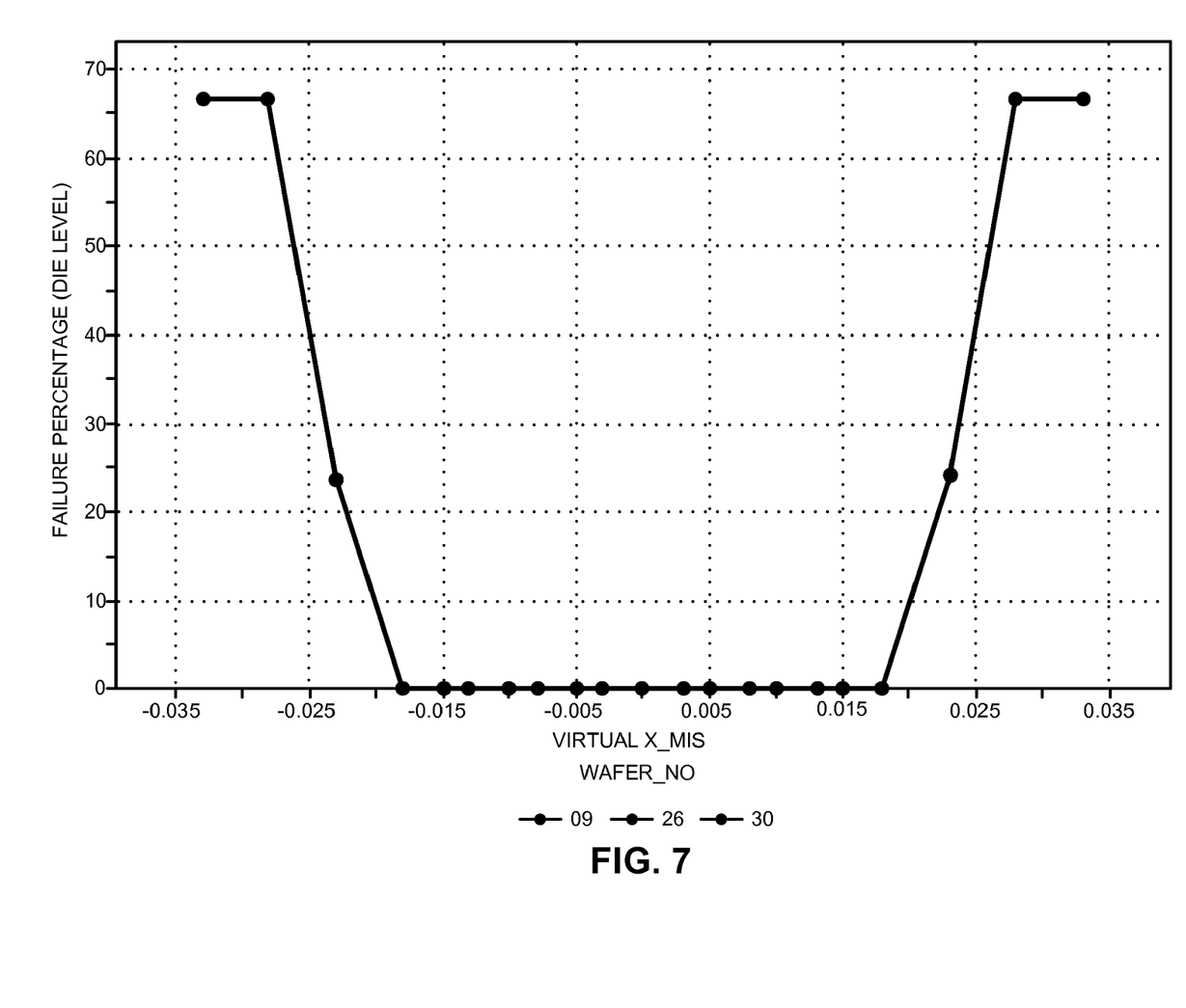
FIG. 7 presents another exemplary graph of performance characteristics obtained from a test wafer in accordance with embodiments of the present invention.

FIG. 4 is a graph illustrating the failure rate of the devices on Wafer 9, FIG. 5 is a graph illustrating the failure rate of the devices on Wafer 26, and FIG. 6 is a graph illustrating the failure rate of the devices on Wafer 30. The three graphs can be combined into a single graph, as illustrated in FIG. 7.

Figure 9:
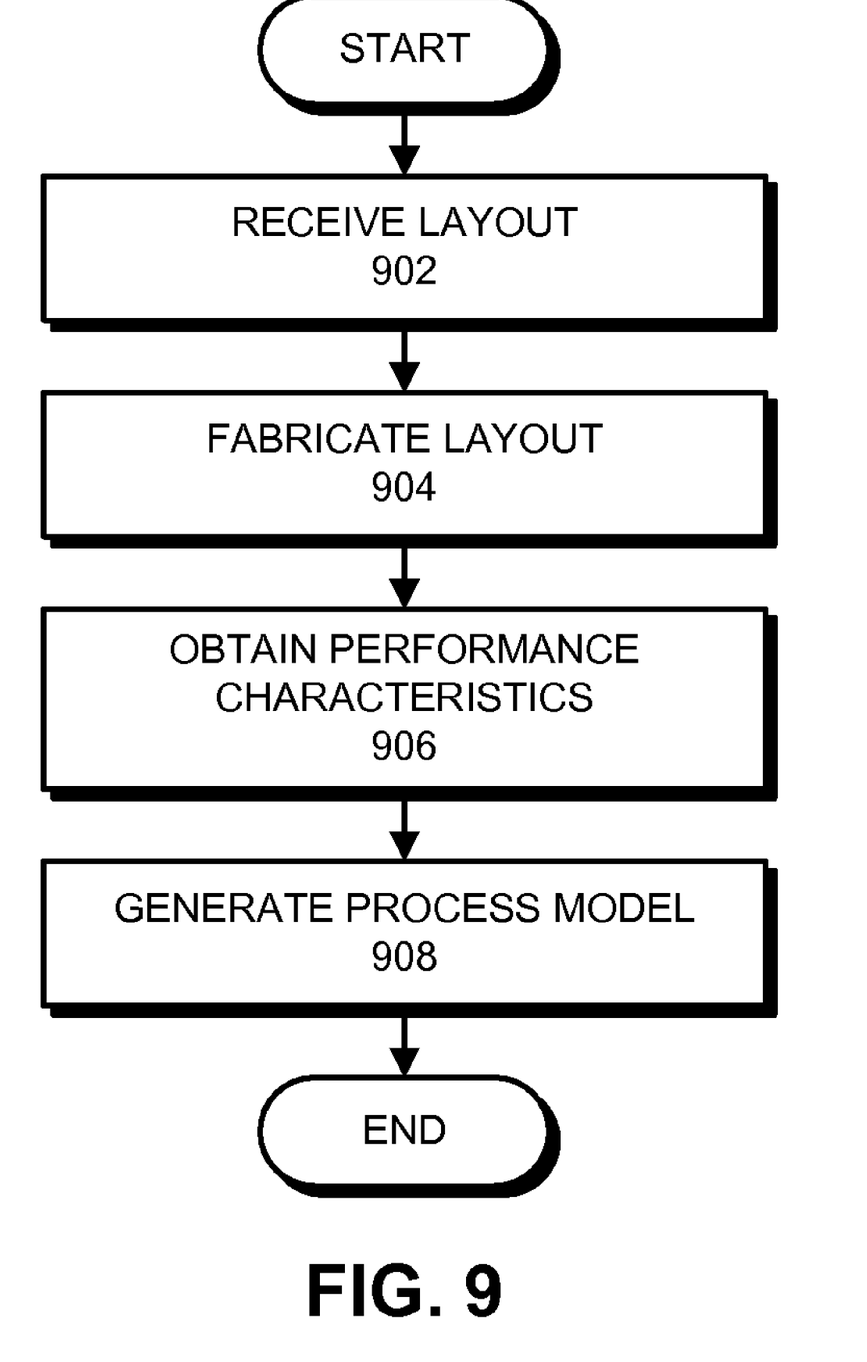
FIG. 9 presents a flow chart illustrating a process for generating a process model in accordance with embodiments of the present invention.

The above-described experimental process is summarized in FIG. 9, which presents a flow chart illustrating a process for generating a process model in accordance with embodiments of the present invention. During operation, the system receives a layout which includes a plurality of test structures for semiconductor devices, wherein each test structure varies one or more design variables (902). The system then fabricates a plurality of wafers based on the layout, wherein each wafer in the plurality of wafers is fabricated using one of a plurality of process settings (904). In some embodiments, each process setting in the plurality of process settings produces specified changes in the values for the one or more design variables.

Next, the system obtains performance characteristics for the plurality of test structures on the plurality of wafers (906). The system then generates a process model that is based on at least the effect that values for the one or more design variables and the plurality of process settings have on the performance characteristics of the plurality of test structures (908). In some embodiments, the performance characteristics include a yield and/or a pass/fail rate. In some embodiments, the process model is a semiconductor device yield model. In some embodiments, the process model predicts performance characteristics for test structures which include values for the one or more design variables that were not included in the layout. In some embodiments, the process model is a parametric equation which is based on at least the plurality of process settings and the values for the one or more design variables.

In some embodiments, the system also measures the specified changes in the values for one or more design variables for a given process setting.

In some embodiments, in addition to being able to graph the results together on a failure rate chart, various figures of merit can be calculated using the calibrated DOE. For examples, these figures of merit can include process window $E_p$ and $E_{pk}$.

Thus, these embodiments allow the user to use both layout DOE and process DOE to determine process characteristics, where previously these characteristics could only be determined with a layout DOE.

Figure 8:
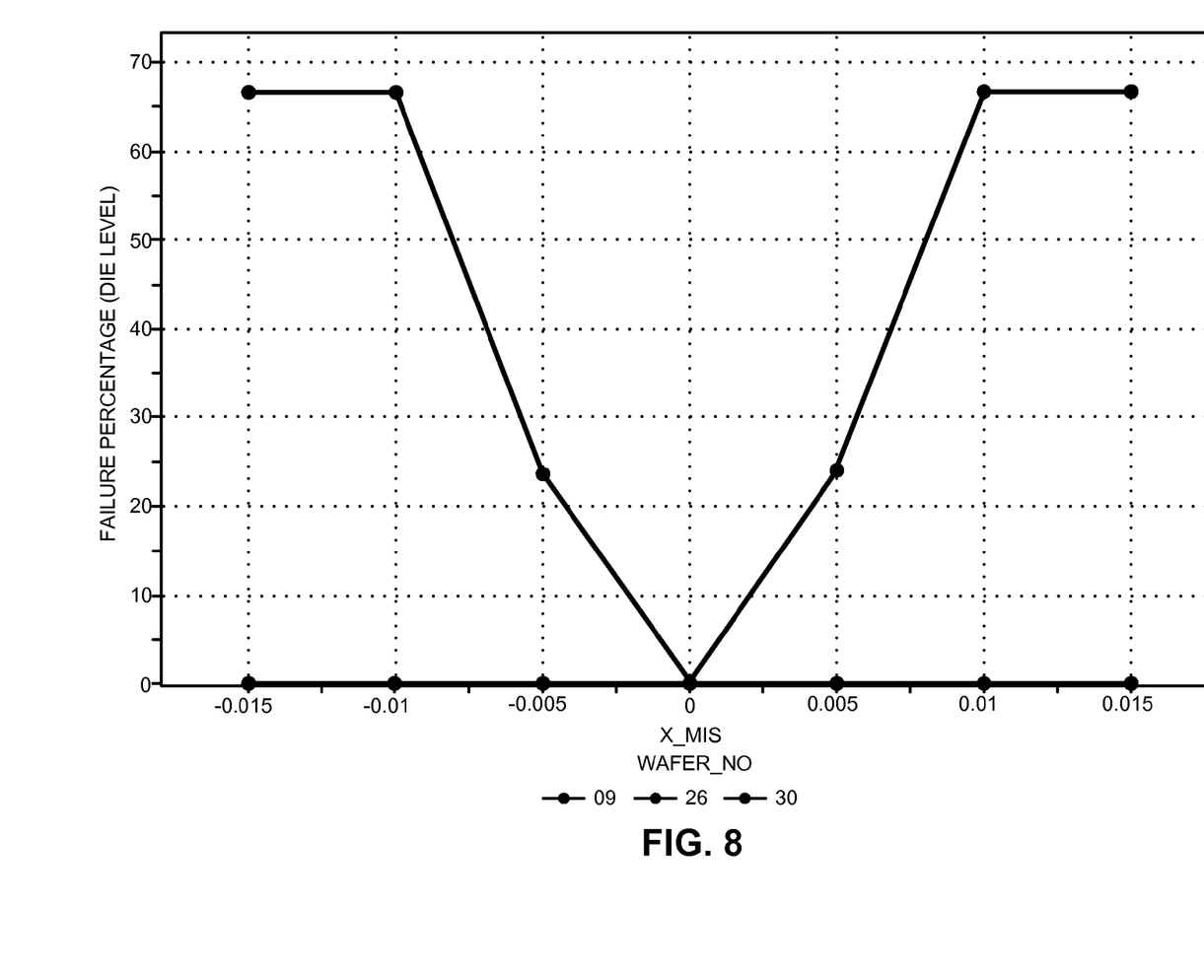
FIG. 8 presents another exemplary graph of performance characteristics obtained from a test wafer in accordance with embodiments of the present invention.

Note that existing wafer testing tools cannot calibrate a layout DOE using data from a process DOE. The only data that could be obtained from existing tools is illustrated in Table 3. As illustrated in Table 3, only the X_MIS values are accounted for in the failure rates, because the effect of the process DOE on the PV cannot be used in the wafer testing tools. FIG. 8 is a graph illustrating the combined failure rates as a function of X_MIS (i.e., the layout DOE). As illustrated in FIG. 8, the failure rate data is incorrect because it includes multiple failure rates for each layout X_MIS value.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

TABLE 1

Process Experiments

| | Tool Setting | Nominal Value | Wafer Average Measured Value |
|---|---|---|---|
| Wafer 30: | X-misalign | 0 nm | 0 nm |
| Wafer 9: | X-misalign | 0 nm | −0.018 um |
| Wafer 26: | X-misalign | 0 nm | 0.018 um |

TABLE 2

Process and Layout Experiment Data

| TDROM Wafer | Measured in-line X-misalign | Layout X_MIS | Virtual Primary Variable for Experiment = <X_MIS> + <X-misalign> | Failure Rate |
|---|---|---|---|---|
| Wafer 9, Experiment 1: | −0.018 um | −0.015 um | −0.033 um | 66.67% |
| Wafer 9, Experiment 2: | −0.018 um | −0.01 um | −0.028 um | 66.67% |
| Wafer 9, Experiment 3: | −0.018 um | −0.005 um | −0.023 um | 23.81% |
| Wafer 9, Experiment 4: | −0.018 um | 0 um | −0.018 um | 0% |
| Wafer 9, Experiment 5: | −0.018 um | 0.005 um | −0.013 um | 0% |
| Wafer 9, Experiment 6: | −0.018 um | 0.01 um | −0.008 um | 0% |
| Wafer 9, Experiment 7: | −0.018 um | 0.015 um | −0.003 um | 0% |
| Wafer 26, Experiment 1: | +0.018 um | −0.015 um | 0.003 um | 0% |
| Wafer 26, Experiment 2: | +0.018 um | −0.01 um | 0.008 um | 0% |
| Wafer 26, Experiment 3: | +0.018 um | −0.005 um | 0.013 um | 0% |
| Wafer 26, Experiment 4: | +0.018 um | 0 um | 0.018 um | 0% |
| Wafer 26, Experiment 5: | +0.018 um | 0.005 um | 0.023 um | 23.81% |
| Wafer 26, Experiment 6: | +0.018 um | 0.01 um | 0.028 um | 66.67% |
| Wafer 26, Experiment 7: | +0.018 um | 0.015 um | 0.033 um | 66.67% |
| Wafer 30, Experiment 1: | 0 um | −0.015 um | −0.015 um | 0% |
| Wafer 30, Experiment 2: | 0 um | −0.01 um | −0.01 um | 0% |
| Wafer 30, Experiment 3: | 0 um | −0.005 um | −0.005 um | 0% |
| Wafer 30, Experiment 4: | 0 um | 0 um | 0 um | 0% |
| Wafer 30, Experiment 5: | 0 um | 0.005 um | 0.005 um | 0% |
| Wafer 30, Experiment 6: | 0 um | 0.01 um | 0.01 um | 0% |
| Wafer 30, Experiment 7: | 0 um | 0.015 um | 0.015 um | 0% |

TABLE 3

Process and Layout Experiment Data

| TDROM Wafer | Layout X_MIS | Failure Rate |
|---|---|---|
| Wafer 9, Experiment 1: | −0.015 um | 66.67% |
| Wafer 9, Experiment 2: | −0.01 um | 66.67% |
| Wafer 9, Experiment 3: | −0.005 um | 23.81% |
| Wafer 9, Experiment 4: | 0 um | 0% |
| Wafer 9, Experiment 5: | 0.005 um | 0% |
| Wafer 9, Experiment 6: | 0.01 um | 0% |
| Wafer 9, Experiment 7: | 0.015 um | 0% |
| Wafer 26, Experiment 1: | −0.015 um | 0% |
| Wafer 26, Experiment 2: | −0.01 um | 0% |
| Wafer 26, Experiment 3: | −0.005 um | 0% |
| Wafer 26, Experiment 4: | 0 um | 0% |
| Wafer 26, Experiment 5: | 0.005 um | 23.81% |
| Wafer 26, Experiment 6: | 0.01 um | 66.67% |
| Wafer 26, Experiment 7: | 0.015 um | 66.67% |
| Wafer 30, Experiment 1: | −0.015 um | 0% |
| Wafer 30, Experiment 2: | −0.01 um | 0% |
| Wafer 30, Experiment 3: | −0.005 um | 0% |
| Wafer 30, Experiment 4: | 0 um | 0% |
| Wafer 30, Experiment 5: | 0.005 um | 0% |
| Wafer 30, Experiment 6: | 0.01 um | 0% |
| Wafer 30, Experiment 7: | 0.015 um | 0% |

What is claimed is:

1. A method for characterizing an integrated circuit (IC) manufacturing process, comprising:
   receiving a layout which includes a plurality of test structures for semiconductor devices, wherein each test structure varies one or more design variables;
   fabricating a plurality of wafers based on the layout, wherein each wafer in the plurality of wafers is fabricated using one of a plurality of process settings of the IC manufacturing process;
   obtaining performance characteristics for the plurality of test structures on the plurality of wafers, wherein the performance characteristics include at least a yield or a pass/fail rate; and
   generating, by computer, a process model that is based on at least the effect that values of the one or more design variables and the plurality of process settings have on the performance characteristics of the plurality of test structures.

2. The method of claim 1, wherein each process setting in the plurality of process settings produces specified changes in the values of the one or more design variables.

3. The method of claim 2, further comprising measuring the specified changes in the values of one or more design variables for a given process setting.

4. The method of claim 1, wherein the process model is a semiconductor device yield model.

5. The method of claim 1, wherein the process model predicts performance characteristics for test structures which include values of the one or more design variables that were not included in the layout.

6. The method of claim 1, wherein the process model is a parametric equation which is based on at least the plurality of process settings and the values of the one or more design variables.

7. A computer-readable storage medium storing instructions that when executed by a computer cause the computer to perform a method for characterizing an integrated circuit (IC) manufacturing process, comprising:
- receiving a layout which includes a plurality of test structures for semiconductor devices, wherein each test structure varies one or more design variables;
- fabricating a plurality of wafers based on the layout, wherein each wafer in the plurality of wafers is fabricated using one of a plurality of process settings of the IC manufacturing process;
- obtaining performance characteristics for the plurality of test structures on the plurality of wafers, wherein the performance characteristics include at least a yield or a pass/fail rate; and
- generating a process model that is based on at least the effect that values of the one or more design variables and the plurality of process settings have on the performance characteristics of the plurality of test structures.

8. The computer-readable storage medium of claim 7, wherein each process setting in the plurality of process settings produces specified changes in the values of the one or more design variables.

9. The computer-readable storage medium of claim 8, wherein the method further comprises measuring the specified changes in the values of one or more design variables for a given process setting.

10. The computer-readable storage medium of claim 7, wherein the process model is a semiconductor device yield model.

11. The computer-readable storage medium of claim 7, wherein the process model predicts performance characteristics for test structures which include values of the one or more design variables that were not included in the layout.

12. The computer-readable storage medium of claim 7, wherein the process model is a parametric equation which is based on at least the plurality of process settings and the values of the one or more design variables.

13. An apparatus, comprising:
- a receiving mechanism configured to receive a layout which includes a plurality of test structures for semiconductor devices, wherein each test structure varies one or more design variables;
- a fabrication mechanism configured to fabricate a plurality of wafers based on the layout, wherein each wafer in the plurality of wafers is fabricated using one of a plurality of process settings of the IC manufacturing process; and
- an analysis mechanism configured to:
  - obtain performance characteristics for the plurality of test structures on the plurality of wafers, wherein the performance characteristics include at least a yield or a pass/fail rate; and
  - generate a process model that is based on at least the effect that values of the one or more design variables and the plurality of process settings have on the performance characteristics of the plurality of test structures.

14. The apparatus of claim 13, wherein each process setting in the plurality of process settings produces specified changes in the values of the one or more design variables.

15. The apparatus of claim 14, further comprising a test mechanism configured to measure the specified changes in the values of one or more design variables for a given process setting.

16. The apparatus of claim 13, wherein the process model is a semiconductor device yield model.

17. The apparatus of claim 13, wherein the process model predicts performance characteristics for test structures which include values of the one or more design variables that were not included in the layout.

18. The apparatus of claim 13, wherein the process model is a parametric equation which is based on at least the plurality of process settings and the values of the one or more design variables.

\* \* \* \* \*